United States Patent
Bhatia

Patent Number: 6,147,301
Date of Patent: Nov. 14, 2000

[54] GRAPHITE-FIBER ENHANCED MOLDED PLASTIC FOR ELECTRONIC ENCLOSURES

[75] Inventor: Rakesh Bhatia, San Jose, Calif.

[73] Assignee: Intel Corporation, Santa Clara, Calif.

[21] Appl. No.: 09/090,709

[22] Filed: Jun. 4, 1998

[51] Int. Cl.$^7$ ............................................. H05K 9/00
[52] U.S. Cl. .................. 174/35 R; 174/35 GC; 174/35 MS; 428/141; 428/143; 428/148
[58] Field of Search ............. 174/35 R, 35 GC, 174/35 MS; 428/148, 141, 143

[56] References Cited

U.S. PATENT DOCUMENTS

| | | | |
|---|---|---|---|
| 5,565,656 | 10/1996 | Mottahed | 174/35 GC |
| 5,827,997 | 10/1998 | Chung et al. | 174/35 MS |
| 5,906,882 | 5/1999 | Valente et al. | 428/148 |

OTHER PUBLICATIONS

Amoco Performance Products, Inc. Brochure, High Thermal Conductivity Pitch Based Graphite Fibers, ThermalGraphR vs. Copper Comparison, Alpharetta, GA, pp. 1–31.

News Release—"Seminar shows status—and promise—of coninjection technology" Cincinnati Milarcron, Plastics Machinery Group, Dec. 1996, pp. 1–3.

Co–Mack Technology, Inc. Homepage, http://www.comack.com/homepage, Co–Mack Technology, Inc. 3151 Scott Street, Vista, CA 92083.

*Primary Examiner*—William A. Cuchlinski, Jr.
*Assistant Examiner*—Ronnie Mancho
*Attorney, Agent, or Firm*—Blakely, Sokoloff, Taylor & Zafman LLP

[57] ABSTRACT

A technique for fabricating an improved electronic enclosure. The electronic enclosure is made of graphite fibers dispersed directionally (non-homogeneous) in an absolac/polycarbonate (ABS/PC) resin mix, of which the composition is molded to form the the plastic enclosure. The graphite concentration is highest along the interior surface of the enclosure to provide improved heat transfer, as well as adequate EMI/RFI shielding. However, the graphite concentration decrease along the thickness, wherein at the outer surface, the graphite concentration level is zero. The directional variation in the graphite loading allows high graphite loading at the interior surface of the enclosure, but retains lower loading at other regions along the thickness so that rigidity and impact resistance are retained for the enclosure.

14 Claims, 6 Drawing Sheets

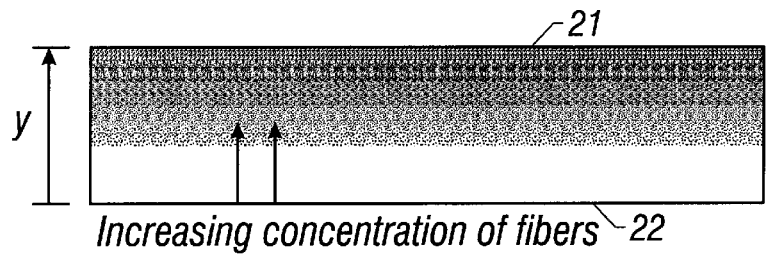
FIG. 6A
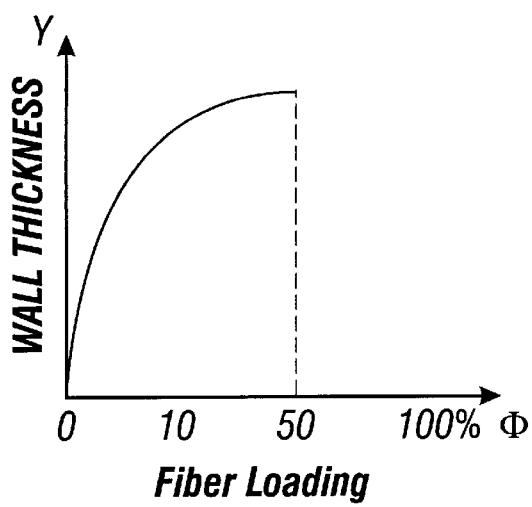 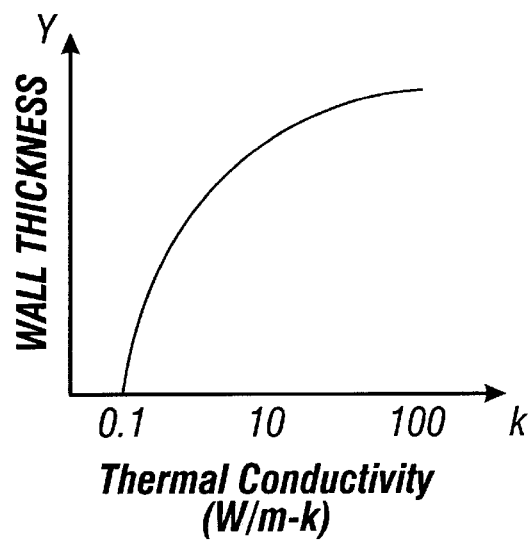
FIG. 6B  FIG. 6C

GRAPHITE-FIBER ENHANCED MOLDED PLASTIC FOR ELECTRONIC ENCLOSURES

BACKGROUND OF THE INVENTION

1. Field of the Invention

The present invention relates to the field of enclosures and, more particularly, to electronic enclosures.

2. Background of the Related Art

The use of a plastic enclosure to house electronic components and assemblies is well known in the art. Most electronic enclosures, such as enclosures for notebook computers, are manufactured by an injection molding or compression molding technique. The plastic molding forms the outer shell or "skin" which provides the necessary structural rigidity, but is light in weight.

Several key requirements are specified when the enclosure is utilized for notebook computers. As noted above, the enclosure should be rigid, but light in weight, so that it can be hand-carried. The enclosure (or casing) should be resistant to cracking or breaking. For example, the enclosure should not shatter, if dropped. Further, the enclosure should be thermally conductive to dissipate heat, so that heat generated by internal components, such as power supplies, can be adequately transferred to the outer surface. Finally, some form of EMI/RFI shielding is needed to electrically shield the internal electronics.

One technique in practice utilizes an absolac/polycarbonate (ABS/PC) resin mix to fabricate the enclosures. Typically, a 60/40 mix of ABS/PC is employed in injection or compression molding to fabricate enclosures with thickness in the range of 1.5 to 2.0 millimeters (mm). A minimum thickness of about 1.5 mm is necessary for this thermoplastic material to provide adequate structural rigidity. The ABS/PC mix offers strength, impact resistance and is economically, cost effective.

However, several disadvantages are noted with the ABS/PC material. For example, the thermal conductivity of ABS/PC resin is quite low (typically less than 0.1 Watts per meter-Kelvin (W/m-K)), so that the heat spreading (dissipation) capability of the plastic is poor. Accordingly, many of today's notebook computers have "hot spots" along the external casing. Additionally, the ABS/PC plastic has poor electrical conductivity so that the interior surface of the enclosure requires some form of metallization (whether a metal skin or sprayed coating) for EMI/RFI shielding.

One technique to improve the properties of the ABS/PC resin material is to introduce graphite fibers into the resin. Graphite fibers are uniformly distributed in the resin when the enclosure is fabricated. Since graphite has higher thermal conductivity than ordinary ABS/PC, the graphite laden ABS/PC improves the thermal dissipation of the plastic. However, when significant amounts of graphite fibers are introduced to improve the thermal properties of the plastic, the amount of graphite present causes the graphite/ABS/PC resin based plastic to become brittle. This causes the impact resistance of the enclosure to degrade and increases the chances that the enclosure will shatter when dropped.

Accordingly, it would be advantageous to provide an enclosure having enhanced thermal conductivity, but without suffering the degradation of impact resistance. The present invention provides for such a scheme in which thermal conductivity is enhanced for a plastic enclosure, but in which the enclosure is not susceptible to breakage from impact, such as when the enclosure is dropped.

SUMMARY OF THE INVENTION

The present invention describes an improved electronic enclosure and the fabrication of such an enclosure. The electronic enclosure of the preferred embodiment is formed from a molded plastic, comprised of graphite fibers dispersed in an absolac/polycarbonate (ABS/PC) resin mix. The graphite loading in the formed enclosure is directional (non-homogeneous), so that the concentration of the graphite varies across the thickness of the formed plastic. The graphite concentration is highest along the interior surface of the enclosure and lowest (or none) along its outer surface. In the preferred graphite/ABS/PC enclosure, the graphite concentration proximal to the interior surface has a value of around 50% and a value of zero along the outer surface.

By having a high graphite concentration loading along the interior surface, thermal conductivity is improved to dissipate the heat away from the internal components. In many instances, hot spots along the outer surface are removed or reduced, due to the high thermal conductivity of the graphite along the interior surface. The improved thermal conductivity allows heat to conduct horizontally along the enclosure, as well as toward the exterior of the enclosure. Although high concentrations of graphite would cause the plastic to become brittle and the case to break (shatter), the enclosure of the present invention does not suffer from degraded impact performance. Since the high concentration levels of graphite are only along the interior surface, the structural rigidity of the ABS/PC based plastic is still retained for most of the thickness of the formed enclosure. Furthermore, the high concentration layer of graphite along the interior surface provides enhanced EMI/RFI shielding, so that a separate metallic skin along the interior of the enclosure is not necessary.

BRIEF DESCRIPTION OF THE DRAWINGS

FIG. 6A is a cross-sectional diagram showing the thickness Y of an enclosure of the present invention, in which the enclosure is formed from a resin base, but in which graphite fibers are directionally distributed in the formed enclosure.

FIG. 6B is a graph showing the concentration of graphite additives as a function of the material thickness Y for the cross-sectional diagram of FIG. 6A, in which the graphite additive concentration varies throughout the thickness of the material.

FIG. 6C is a graph showing the thermal conductivity as a function of the material thickness Y of FIG. 6A, in which the thermal conductivity varies in response to the graphite concentration noted in FIG. 6B.

DETAILED DESCRIPTION OF THE INVENTION

A technique for providing an improved electronic enclosure is described. In the following description, numerous specific details are set forth, such as specific materials, structures, processes, measurements, etc., in order to provide a thorough understanding of the present invention. However, it will be appreciated by one skilled in the art that the present invention may be practiced without these specific details. In other instances, well known techniques and structures have not been described in detail in order not to obscure the present invention.

Figure 1:
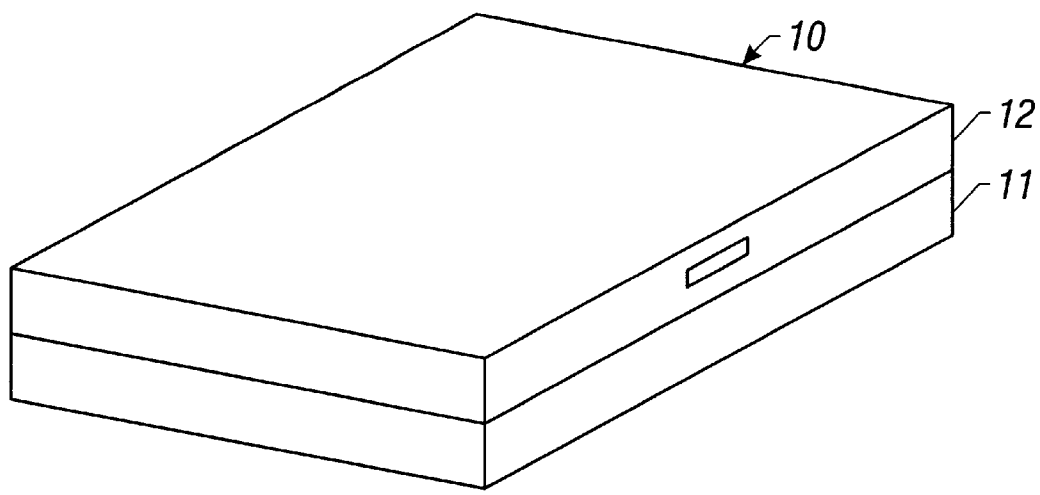
FIG. 1 is a pictorial illustration of a notebook computer according to the prior art.
Figure 2:
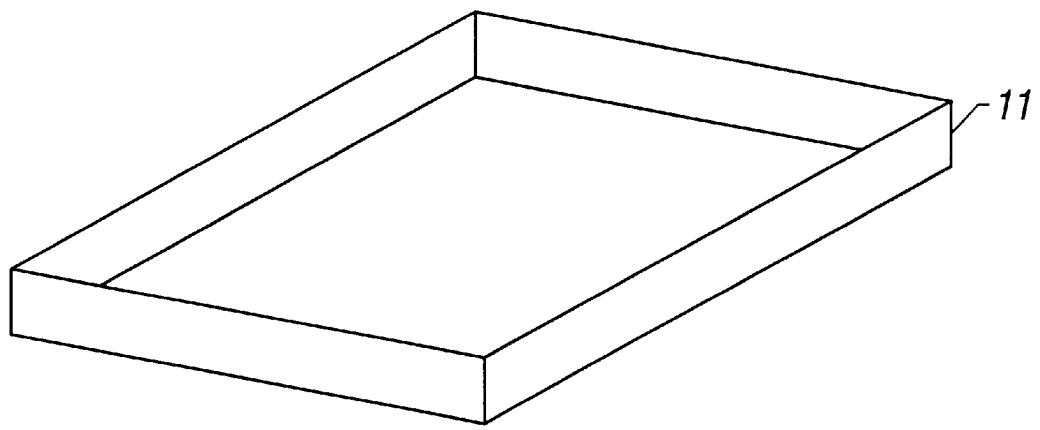
FIG. 2 is a pictorial illustration of an enclosure which is used to form the bottom casing portion of the notebook computer in FIG. 1.

Referring to FIG. 1, a notebook computer 10 is shown with its casing cover 12 closed. A variety of notebook computers are in use today and their construction and use are well known. Generally, to house the various electronic components and assemblies, an enclosure (also referred to as a casing or housing) is required. Although the enclosure can come in different shapes and sizes, it is essentially a container to house the electronics. Thus, a base enclosure 11, which forms the bottom portion of the notebook computer 10, is also shown in FIG. 2. For the most part, the enclosure 11 is a box shaped container for housing the electronics and the keyboard, and is subsequently mated (by hinges or other coupling mechanisms) to the cover 12, which typically houses the display unit.

As noted in the Background section above, notebook computer enclosures are manufactured by an injection or compression molding technique. Therefore, the enclosure 11 (as well as cover 12 for most instances) is a thermoplastic molding that forms the outer shell or "skin" of the notebook computer. This shell needs to provide the necessary structural rigidity for holding the electronics, but it should be light in weight so that it can be hand-carried. The enclosure should be thermally conductive to dissipate heat and some form of electromagnetic interference or radio frequency interference (EMI/RFI) shielding is needed to electrically shield the internal electronics. Metallization of the interior skin surface of the enclosure achieves this purpose.

One commonly practiced technique utilizes an absolac/polycarbonate (ABS/PC) resin mix to fabricate the enclosures. Typically, a 60/40 mix of ABS/PC is employed for injection or compression molding to fabricate enclosures with thickness in the range of 1.5 to 2.0 millimeters (mm). A minimum thickness of about 1.5 mm is necessary for this plastic to provide adequate structural rigidity. The ABS/PC mix offers strength, impact resistance and is economically, cost effective.

However, the thermal conductivity of ABS/PC resin is quite low (typically less than 0.1 Watts per meter-Kelvin (W/m-K)), so that the heat spreading (dissipation) capability of the plastic is poor. Accordingly, many of today's notebook computers have "hot spots" along the external surface of the casing. Additionally, the ABS/PC plastic has poor electrical conductivity so that the interior surface of the enclosure typically requires some form of metallization (whether a metal skin or sprayed coating) for EMI/RFI shielding.

Figure 3A:
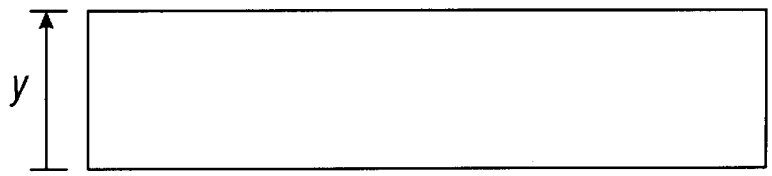
FIG. 3A is a cross-sectional diagram showing the thickness Y of a prior art enclosure formed from a resin, in which no graphite fibers are introduced.
Figure 3B:
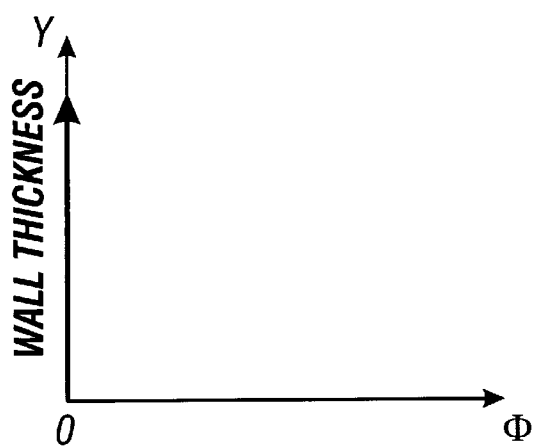
FIG. 3B is a graph showing the concentration of graphite additives as a function of the material thickness Y for the cross-sectional diagram of FIG. 3A, in which no graphite additives are present.
Figure 3C:
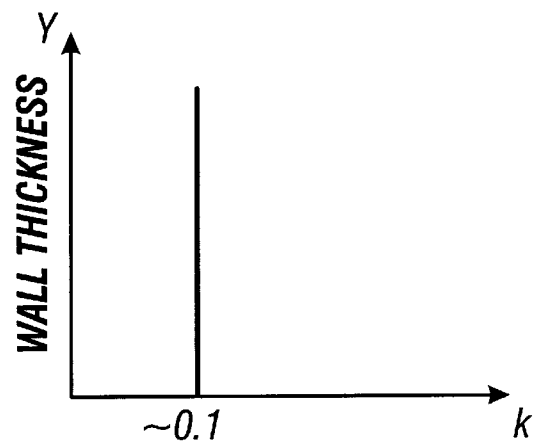
FIG. 3C is a graph showing the thermal conductivity as a function of the material thickness Y of FIG. 3A, in which the thermal conductivity is in response to the graphite concentration noted in FIG. 3B.

Referring to FIGS. 3A–C, properties associated with the ABS/PC resin are illustrated. FIG. 3A illustrates the cross-section along the thickness of the ABS/PC formed plastic, such as the floor (bottom plate) or side of the enclosure 11. That is, the height or thickness Y corresponds to the wall thickness of the ABS/PC plastic material forming the enclosure 11. FIG. 3B illustrates the amount of an additive ($\phi$), also referred to as fiber loading, present as a function of the thickness Y and FIG. 3C illustrates the thermal conductivity of the material as a function of the thickness Y. In this particular example, the ABS/PC resin is utilized without any additives. Accordingly, FIG. 3B shows that no additives are present at all in the plastic material (that is, $\phi=0$) and the thermal conductivity is shown as a constant of approximately 0.1 W/m-K for a 60/40 mix of ABS/PC.

Figure 4:
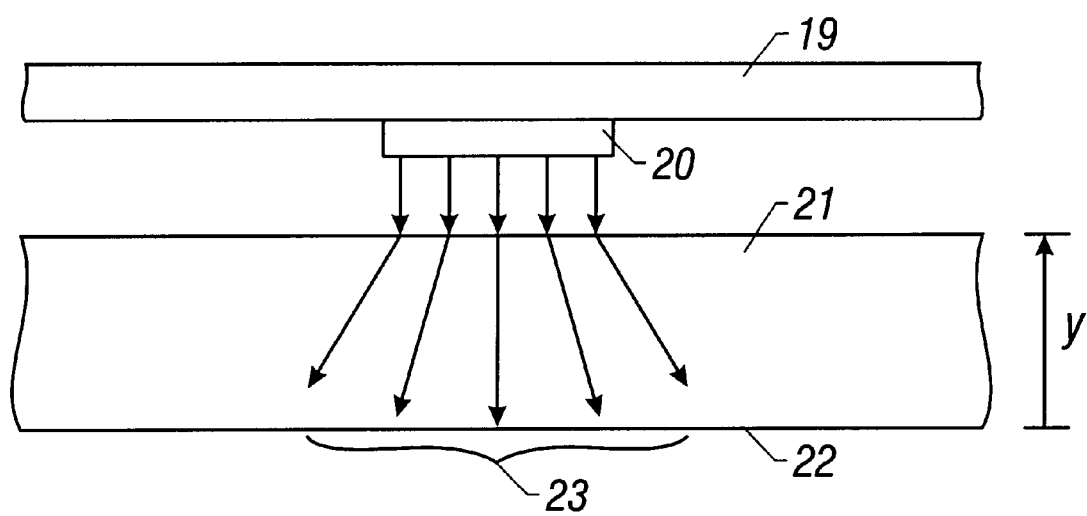
FIG. 4 is a cross-sectional diagram of the prior art enclosure thickness Y of FIG. 3A, in which a heat generating component within the interior of the enclosure causes hot spots along the external surface, when graphite fibers are not present in the enclosure.

The hot spots which result from the poor thermal conductivity is illustrated in FIG. 4. FIG. 4 shows the instance when a heat generating circuit component 20 (such as an integrated circuit mounted on a circuit board 19) is located proximal to the enclosure surface. In the illustration, surface 21 exemplifies the inside surface of the enclosure 11 and surface 22 exemplifies the external surface of the enclosure 11. Since the thermal conductivity is constant in the material and since the thermal conductivity is low (in the order of 0.1 W/m-K), the heat transfer across the enclosure thickness Y is localized to the region adjacent to the heat generating component 20. Therefore, a hot spot 23 results at the external surface 22 of the enclosure in the vicinity opposite the heat generating component 20.

If the heat generation in the notebook computer is substantial and the enclosure cannot dissipate the heat adequately, some other mechanism (such as cross ventilation, or even a fan) will be needed to properly dissipate the heat from the interior of the enclosure 11 to the external environment. Additionally, with the enclosure 11 formed strictly from the ABS/PC resin, some form of metallic lining is required along the internal surface 21 for EMI/RFI shielding. Typically, metal plates or sprayed coating (skin) will be used to provide the metallization along the interior surface 21 of the enclosure 11.

One technique to improve the properties of the ABS/PC resin material is to introduce an additive into the resin to enhance thermal conductivity. One such additive is graphite. Graphite fibers, having thermal conductivity in the range 400 to 1100 W/m-K, are commercially available from various vendors (such as Amoco Corporation). The fibers are ground and mixed into the resin. Subsequently, the graphite/resin mixture is utilized in the molding process to form the plastic material.

For example, this technique is utilized to introduce graphite fibers into the ABS/PC resin to form a graphite/ABS/PC plastic, in which the graphite fiber composition (by volume) is approximately 40%. Since the graphite/resin composition is mixed into the 40%–60% ABS/PC ratio prior to molding, the resulting molded plastic has a homogeneous distribution of the graphite when the enclosure is fabricated. The cross-section of the formed graphite/ABS/PC plastic and the associated graphs are illustrated in FIGS. 5A–C.

Figure 5A:
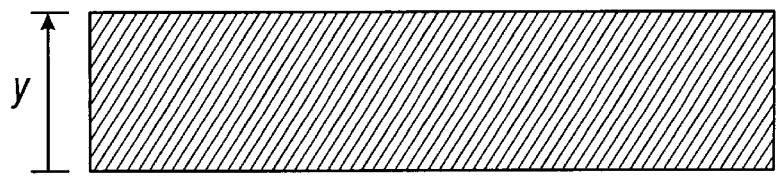
FIG. 5A is a cross-sectional diagram showing the thickness Y of another prior art enclosure formed from a resin, in which graphite fibers are distributed homogeneously in the formed enclosure.
Figure 5B:
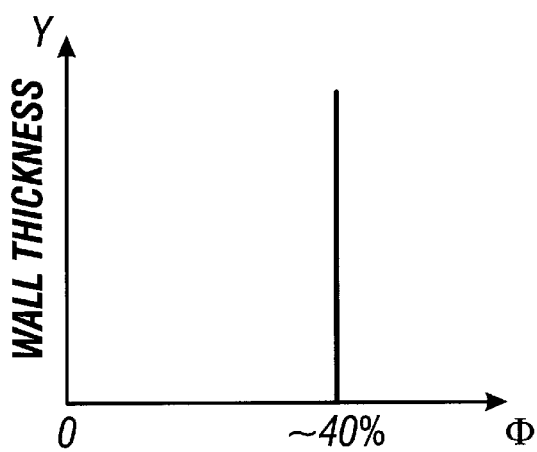
FIG. 5B is a graph showing the concentration of graphite additives as a function of the material thickness Y for the cross-sectional diagram of FIG. 5A, in which the graphite additive concentration is a constant throughout the thickness of the material.
Figure 5C:
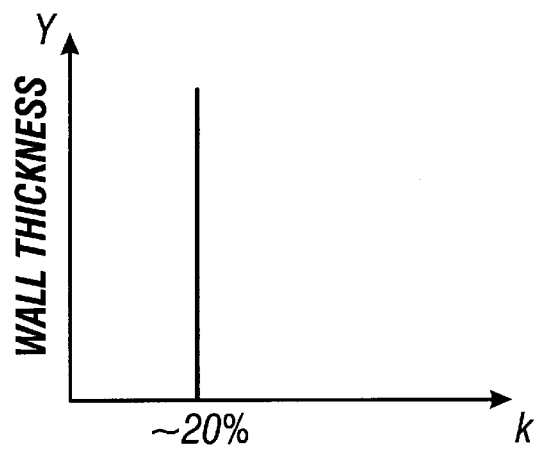
FIG. 5C is a graph showing the thermal conductivity as a function of the material thickness Y of FIG. 5A, in which the thermal conductivity is in response to the graphite concentration noted in FIG. 5B.

FIG. 5A shows the cross-section of the enclosure 11 when a graphite distributed plastic is utilized to fabricate the enclosure. Utilizing the known technique of mixing the graphite fibers in the ABS/PC plastic forming resin, a homogeneous plastic composition is formed. That is, the graphite is uniformly distributed along the thickness Y. The uniform distribution of graphite in the enclosure material is illustrated in FIG. 5B. The example shows a mixture ratio of 40% graphite and 60% ABS/PC resin (again, the ABS/PC ratio is 60/40). Due to the uniform distribution of graphite, at this ratio the plastic material has a uniform heat dissipation factor of approximately 20 W/m-K, which is illustrated in FIG. 5C.

As noted earlier, the graphite has higher thermal conductivity than ordinary ABS/PC and, accordingly, the graphite/ABS/PC composition improves the thermal transfer across the material thickness Y. An added advantage of using graphite is its ability to function as a EMI/RFI shield. That is, with the presence of proper amounts of graphite material, it can provide the necessary EMI/RFI shielding without the need for a metallic lining along the inside surface of the enclosure.

It would appear that a significantly higher presence of graphite in the composition would further improve the thermal conductivity and shielding properties of the composite material. Unfortunately, when sufficiently high amounts of graphite fibers are introduced, the graphite causes the formed plastic to become brittle, which is an undesirable feature. The degradation in the impact resistance of the plastic material can result in the enclosure to shatter when dropped. Thus, a compromise ratio of graphite to the ABS/PC resin must be determined, which will provide adequate thermal and shielding properties, but will not cause the enclosure to become too brittle.

The example of FIGS. 5A–C shows a ratio of 40% as the optimum value for providing the necessary EMI/RFI shielding and improved thermal conductivity. It is believed that a graphite to ABS/PC ratio of under 40% approximately would not provide the necessary EMI/RFI shielding for the graphite/ABS/PC based enclosure. However, even at the 40% graphite load factor, the resulting material is still too brittle for use as an enclosure for notebook computers. That is, the enclosure would still tend to shatter when subjected to an impact force (such as when dropped) and, therefore, would not be acceptable as an enclosure for notebook computers.

In order to solve the above problems, the present invention utilizes a directionally distributed graphite loading factor, which is illustrated in FIG. 6A. FIGS. 6B–C show the loading factor and the thermal conductivity as a function of the material thickness Y. Instead of having a homogeneous loading of the graphite in the ABS/PC resin (as illustrated in FIGS. 5A–C), the present invention applies directional (non-homogeneous) loading of the graphite. The directional loading is achieved by the increase in the concentration of the graphite across the thickness Y. That is, as illustrated in FIG. 6A, the concentration of the graphite is densest at the interior surface 21 and decreases in concentration, when traversing toward the outer surface 22. The concentration of the graphite at the outer surface is at a minimal value.

The graph of FIG. 6B illustrates the graphite concentration profile (graphite loading) as a function of the material thickness for the graphite/ABS/PC enclosure of the preferred embodiment. The loading function is non-linear in this instance. At the one surface (outer surface 22), the loading factor is zero. At the opposite surface (interior surface 21) the loading factor is at the maximum value. The maximum loading factor for the preferred embodiment is 50% (by volume) graphite to a 60/40 mix of ABS/PC. The graphite distribution is such that there is very little graphite loading, if any, initially and the loading increases until the maximum value is reached at the surface 22.

It is appreciated that the loading curve of FIG. 6B can take various shapes, depending on the function of the graphite loading profile desired. It could also be linear across part of or all of the thickness Y. It could also be a step function, although the preference is for it to be a continuous curve. The curve of FIG. 6B shows zero loading at the exterior surface 22 and maximum loading of 50% at the interior surface 21. A corresponding thermal conductivity curve is shown in FIG. 6C. When using the 60/40 ABS/PC resin mix, the thermal conductivity at the outer surface is 0.1 W/m-K, which is the thermal conductivity of the unloaded ABS/PC resin. At the interior surface, the thermal conductivity will depend on the concentration of the graphite. In the preferred technique, this loading factor is set at 50%, which corresponds to approximately to 100 W/m-K for a 60/40 mix of ABS/PC.

Several advantages are noted with the enclosure of the present invention over the prior art enclosures. A higher concentration of graphite loading can be used for electronic enclosures (such as enclosure 11). Since the high concentration levels are localized along one surface only, the low impact resistance properties of the material are also localized along this surface. However, since the remaining thickness of the material has lower concentration of graphite, the brittleness diminishes correspondingly, where upon at the outer surface, the impact resistance is at the highest value. With proper loading profiles, substantially high concentration levels of the graphite can be achieved at the interior surface 21, but the whole enclosure still has high impact resistance. The loading factor at the interior surface 21 can exceed loading factors which are not suitable for enclosures fabricated from uniformly loaded materials. Since the loading is substantially high along the interior surface, the EMI/RFI shielding properties are further enhanced. With sufficient graphite concentration, additional metallization is not needed along the interior surface.

Figure 7:
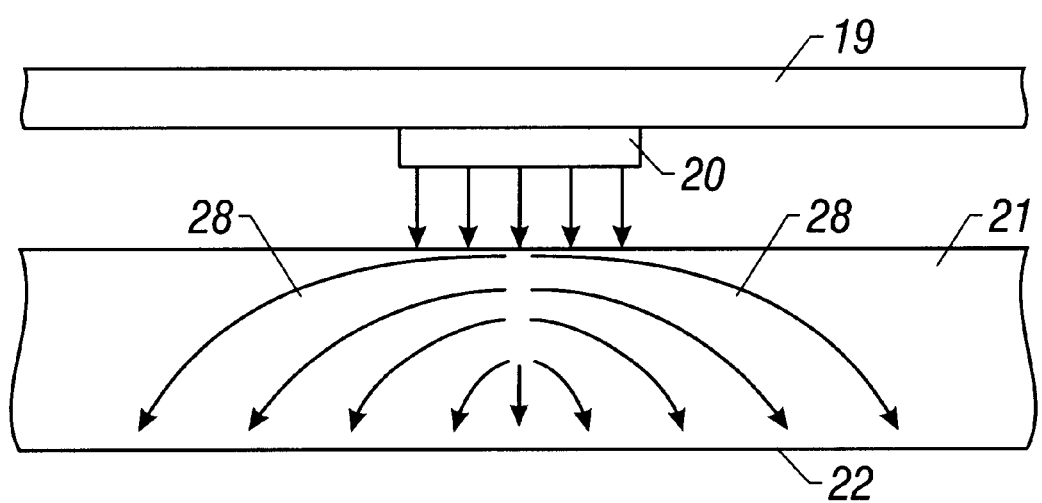
FIG. 7 is a cross-sectional diagram of the enclosure thickness Y of FIG. 6A, in which the improved thermal conductivity, due to the higher concentration of graphite adjacent to the interior surface, reduces or prevents hot spots along the exterior surface of the enclosure.

Another advantageous feature is illustrated in FIG. 7. FIG. 7 shows the heat dissipation from a heat generation component, similar to the component 20 (shown in FIG. 4). The high graphite concentration along the surface 21 presents a high thermal conductivity region along this surface and causes the heat to be conducted more in the horizontal direction (as noted by arrows 28). The heat dissipation to the outside of the enclosure is enhanced due to the presence of the graphite and due to the heat being distributed across a wider surface area. Accordingly, local hot spots are either reduced in temperature or do not occur at all. Thus, the present invention permits a more distributed heat dissipation to the external environment.

It is appreciated that a variety of techniques can be employed to manufacture an enclosure having the directionally distributed graphite concentration, in which the graphite is loaded into a resin base, such as the afore-mentioned ABS/PC resin. For example, in one technique, the injection or compression molding technique known in the prior art is utilized. Furthermore, co-injection techniques allow for the injection of two different materials. Co-injection processes are provided by such vendors as Cincinnati Milacron of Cincinnati, Ohio and Co-Mack Technologies, Inc. of Vista, Calif.

Instead of using a single injector, two (or two sets of) injectors are used. The first injector feeds in the ABS/PC resin. The second injects the graphite/ABS/PC resin mixture having a concentration of graphite particles which correspond to the highest loading factor of graphite to be used. When forming the outer surface 22, only the ABS/PC injector is activated. When the graphite loading is to commence at a particular thickness, the second injector is activated. The amount of ABS/PC injection from the first injector and the amount of graphite/ABS/PC injection from the second injector are varied pursuant to the loading profile desired. When forming the interior region, the first injector is turned off, so that the layer adjacent to the interior is formed by the mixture from the second injector alone. It is appreciated that the injection loading profile can be computer controlled for accurately obtaining the desired graphite loading profile desired.

Accordingly, by the practice of the present invention, an improved electronic enclosure can be fabricated. The enclosure provides for enhanced heat transfer and dissipation, while maintaining structural rigidity which is not susceptible to breakage. The improved enclosure also provides EMI/RFI shielding without a separate metallic skin along the interior surface. In some instances, it may be possible to reduce the thickness of the enclosure wall, since the fiber-reinforced material can be structurally more rigid. Thus, a reduction in the size and/or weight of the portable device (such as the computer of FIG. 1) can be achieved.

Thus, an improved electronic enclosure and a technique for fabricating such an enclosure is described.

I claim:

1. An enclosure comprising:
   a rigid support housing for an electronic component, said rigid support housing having an interior surface and an exterior surface;
   a base portion of said rigid support housing; and
   side portions of said rigid support housing,
   said enclosure fabricated from a plastic material having an additive directionally distributed to have a varying concentration along a thickness of said plastic material,
   said directional distribution having a higher additive concentration along said interior surface than along said exterior surface of said enclosure to remove heat generated by said electronic component,
   said higher additive concentration being approximately 50% by volume to said plastic material so as to enhance thermal conductivity.

2. The enclosure of claim 19 wherein the additive concentration along the interior surface of the enclosure is of sufficient concentration in the plastic material to provide shielding for electrical or magnetic interference.

3. The enclosure of claim 2 wherein the additive is comprised of graphite fibers.

4. The enclosure of claim 3 wherein the plastic material is molded from a resin comprised of absolac and polycarbonate.

5. The enclosure of claim 1 wherein the additive concentration by volume is approximately 0% near the exterior surface.

6. An improved electronic enclosure formed to provide a rigid support housing for an electronic component, said enclosure fabricated from a plastic material, said improvement comprising an additive directionally distributed along a thickness of the plastic material, said directional distribution having a varying additive concentration with a higher additive concentration proximal to an interior surface of said enclosure than along an exterior surface of said enclosure, said higher additive concentration being sufficient to provide shielding for electrical or magnetic interference and being approximately 50% by volume to said plastic material to correspond with approximately 100 Watts per meter Kelvin of thermal conductivity.

7. The improvement of claim 6 wherein the additive is comprised of graphite fibers.

8. The improvement of claim 7 wherein the plastic material is molded from a resin comprised of absolac and polycarbonate.

9. The improvement of claim 6 wherein the additive concentration by volume is approximately 0% near the exterior surface.

10. An enclosure for housing an electronic component comprising:
    a floor plate;
    a plurality of side plates coupled to said floor plate;
    said floor and side plates forming a rigid support housing for housing the electronic component;
    said floor and side plates being fabricated from a plastic material in which an additive is directionally distributed along a thickness of the plastic material to enhance thermal conductivity, the directional distribution having a varying additive concentration, such that a higher additive concentration resides proximal to an interior surface of said enclosure and decreases along the thickness until a minimum additive concentration resides proximal to an exterior surface of said enclosure, said higher additive concentration being approximately 50% by volume to said plastic material so as to enhance thermal conductivity.

11. The enclosure of claim 10 wherein the additive concentration proximal to the interior surface of the enclosure is of sufficient concentration in the plastic material to provide shielding for electrical or magnetic interference.

12. The enclosure of claim 11 wherein the additive is comprised of graphite fibers.

13. The improvement of claim 12 wherein the plastic material is molded from a resin comprised of absolac and polycarbonate.

14. The improvement of claim 13 wherein the additive concentration by volume is approximately 0% near the exterior surface.

* * * * *